United States Patent [19]
Sutula et al.

[11] Patent Number: 5,349,660
[45] Date of Patent: Sep. 20, 1994

[54] METHOD OF IMPROVING PERFORMANCE IN AN AUTOMATED TEST SYSTEM

[75] Inventors: Bryan J. Sutula; Jerry D. Metz, both of Loveland, Colo.

[73] Assignee: Hewlett-Pacakard Company, Palo Alto, Calif.

[21] Appl. No.: 828,534

[22] Filed: Jan. 24, 1992

[51] Int. Cl.⁵ .............................................. G06F 11/22
[52] U.S. Cl. .............................. 395/700; 364/DIG. 1; 364/221.7; 364/286
[58] Field of Search ................... 364/DIG. 1, DIG. 2, 364/579; 395/700; 371/15.1

[56] References Cited

U.S. PATENT DOCUMENTS 4,402,055  8/1983  Lloyd et al. .................. 363/DIG. 2
5,247,693  9/1993  Bristol .......................... 364/DIG. 1

FOREIGN PATENT DOCUMENTS

0373132A3  6/1990  European Pat. Off. .

OTHER PUBLICATIONS

"Conversion of Modified AVP Format into Assembly Code", *IBM Technical Disclosure Bulletin*, vol. 32, No. 9A, Feb. 1990, pp. 299–300.

*Primary Examiner*—Thomas M. Heckler

[57] ABSTRACT

Disclosed is a system which compiles instrument commands from a test instrument programming language, along with data in the commands, into a machine usable form. The machine usable instructions thus sent to the instrument are significantly smaller than the original human readable ASCII characters of the source language, and the machine usable form of the commands avoids additional parsing in the instrument. During the compilation process, all parameter data being sent to an instrument is placed into a single data structure, which reduces the number of parameters passed between the test software and any device drivers used to access the instrument.

7 Claims, 4 Drawing Sheets

FIG. 1

PRIOR ART

METHOD OF IMPROVING PERFORMANCE IN AN AUTOMATED TEST SYSTEM

FIELD OF THE INVENTION

This invention relates to electronic test and measurement instruments and more particularly to computerized control of such measurement instruments. Even more particularly, the invention relates to compiling an instrument control language to improve performance in a computer controlled test system.

BACKGROUND OF THE INVENTION

Many types of electronic test instruments can be controlled from a computer to create a computerized test system. The control of these instruments is accomplished by sending the instruments commands which consist of characters, typically in the ASCII character set. The command characters form words which are understandable by engineers and programmers in order to make the programming of the instruments easier.

In an automated test system, the instrument commands are embedded within the programming statements of a conventional programming language used to create test software. The conventional programming language statements may be compiled or interpreted, however, the instrument commands remain in their original, human readable form as character strings within the resulting test software. During processing of the test software, these character strings are sent to an instrument to cause it to perform some test function, and the results, usually in character string form, are returned to the test software.

When programmability was first introduced into test and measurement instruments, the instrument commands were cryptic and often the data sent and received from the instrument was in a computer readable, binary, form, rather that in a displayable format such as ASCII. This binary form, however, was difficult to read and interpret by the test design engineer, so a more readable, character oriented, form was adopted.

In order to use the character oriented form, however, the program commands and data must be parsed by the instrument and converted into a machine usable form. Also, after an instrument performs the requested function, any resulting data contained in the instrument would be converted back into a character oriented form before it is returned to the computer that requested the operation. When the test software in the computer must process this resulting data, rather than simply display it to a user, the data must be re-converted back into a machine usable form before the processing can be performed.

While all this parsing, conversion and re-conversion takes processing time, and thus degrades the performance of the test system, it has been considered necessary in order to allow the commands and data to remain in a human readable form.

In a typical test environment, many instrument operations are repeated over a long period of time. Thus each time an operation is performed, the program command interpretation and the data conversion must be repeated for each operation. For example if an instrument is programmed to take several thousand measurements—a very common occurrence—the measurement command and resulting data would be interpreted and converted several thousand times.

Often instruments are connected over a serial interface, such as RS-232, or an instrument bus, such as the IEEE 488 bus. Because of the speed of these busses, instrument performance is significantly affected by the amount of data interchanged with an instrument. Although human readable ASCII characters improve the ability to understand the commands and data, performance is limited by interchanging commands and data in this format.

There is need in the art then for a system that can reduce the time needed to perform an operation, while maintaining the human readability of the instrument programming commands and data. Another need in the art is for a system that improves the efficiency of moving information from the computer system to and from the instrument. A further need is for a system that avoids command interpretation and data conversion of each command sent to an instrument. A still further need is for such a system to avoid converting data that is sent from an instrument back to a computerized test system. The present invention meets these and other needs.

SUMMARY OF THE INVENTION

It is an aspect of the present invention to compile the statements of an instrument control language, along with the conventional programming language statements of test software, prior to execution of the statements.

It is another aspect of the invention to compile the Standard Commands for Programmable Instruments language.

Another aspect of the invention is to compile the commands in a manner that allows all parameter information to be passed to an instrument driver in a single data structure.

Another aspect of the invention is to compile the commands in a manner that allows the each parameter passed to have an associated type specification.

Another aspect of the invention is to compile the commands in a manner that allows the each parameter to be passed in a character array, regardless of the actual format of the parameter data.

A further aspect is to optimize the compiled code during the compilation process.

The above and other aspects of the invention are accomplished in a system which compiles instrument commands and data into a machine usable form at the same time that the conventional programming language statements of the test software containing the instrument commands is compiled. The compiled instrument commands then sent to the instrument are significantly smaller than the original human readable instrument commands comprising ASCII characters. Since the compiled commands are already in machine usable form, there is no need to parse the commands in the instrument thus improving instrument performance. Because of the compilation of the commands, the data associated with the commands is also placed in machine usable form, which is smaller than the human readable form, so less time is required to send and receive data from the instrument.

During the compilation process, all parameter data being sent to an instrument is placed into a single data structure, which reduces the number of parameters passed between the test software and any device drivers used to access the instrument. Also, data returned from the instrument is placed in a single data structure.

Each parameter stored in the data structure is stored in an area defined with a single format, and the actual format of the data is defined in a type parameter associated with the parameter. This provides for efficiency in moving data to and from an instrument.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
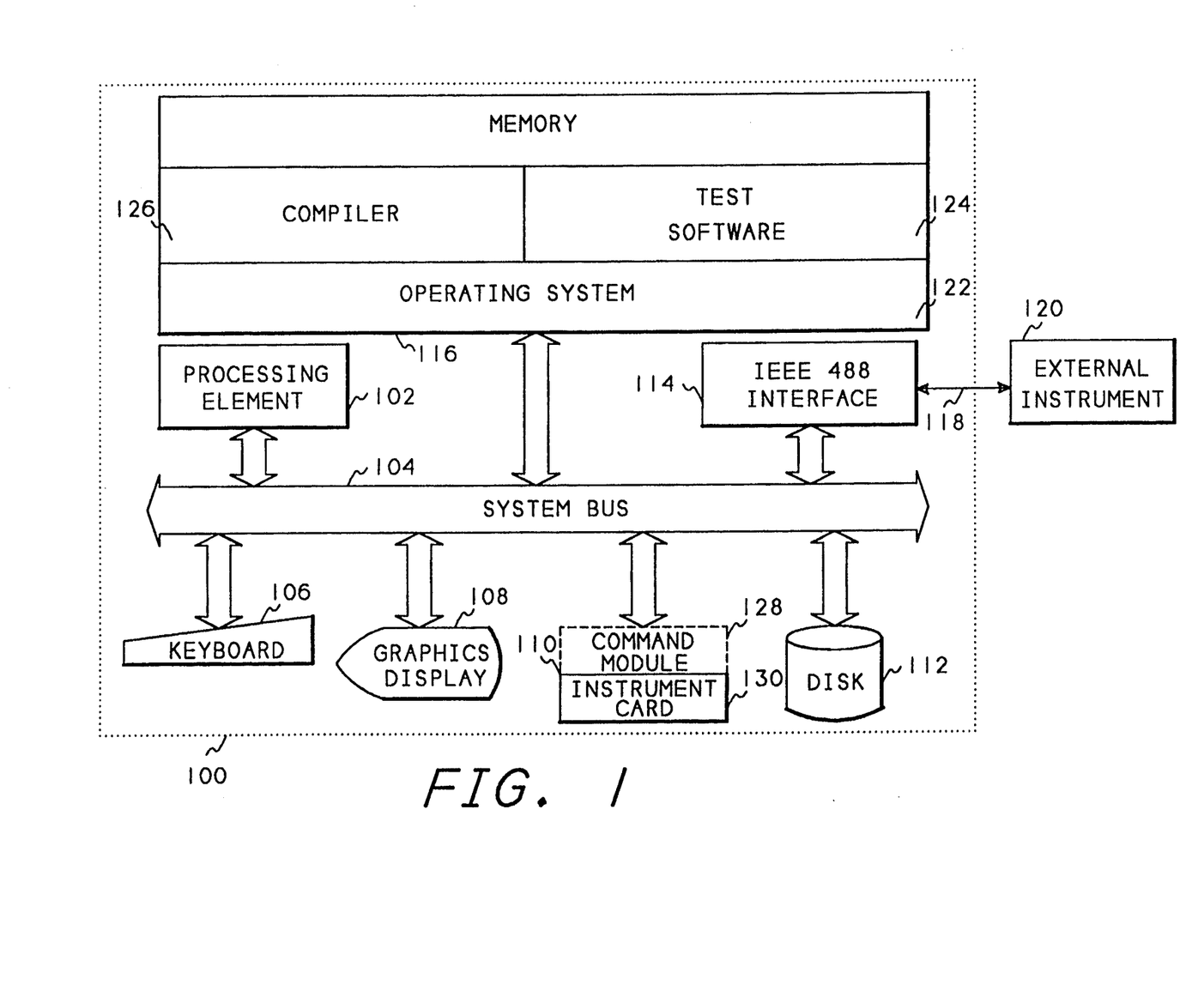
FIG. 1 shows a block diagram of a computer system incorporating the present invention.

FIG. 1 shows a block diagram of a computer system incorporating the present invention. Referring now to FIG. 1, a computer system 100 contains a processing element 102 which processes the instructions created by the present invention. The processing element 102 communicates to other elements of the computer system 100 over a system bus 104. A keyboard 106 is used by the user of the system to input information to the computer system 100, and a display 108 is used by the computer system 100 to output information to the user. A disk 112 is used to store the software and data of the present invention. A memory 116 attached to the system bus 104 contains an operating system 122, the compiler 126 of the present invention, and test software 124 created by the compiler 126.

Electronic test and measurement instruments may be connected to the computer system 100 in several different ways. For example, internal instrument 110 may be connected directly to the system bus 104 of the computer system 100. As will be described below, a command module 128 may or may not be needed to connect the instrument card 130 to the system. When connected directly to the system bus, data and command registers on the internal instrument 110 can be directly read and written to by instructions processed by the processing element 102.

An electronic instrument can also be connected over a standard instrument bus, for example external instrument 120 is connected over an IEEE 488 bus 118 to an IEEE 488 interface card 114 which in turn connects to the system bus 104. To access external instrument 120, software in the memory 116 must send data through the interface 114 over the instrument bus 118 to the instrument 120. Conversely, any data received from the external instrument 120 must also traverse the bus 118 through the interface 114 and into memory 116. When connected in this manner, all information sent to the external instrument 120 and received from the external instrument 120 must be sent or received through the bus 118. Thus, connecting an instrument over a bus, such as the bus 118, prevents any direct access to the registers within an instrument.

Although not shown in FIG. 1, an external instrument could also be connected through a common serial interface, such as RS-232.

In order to program the internal instrument 110 or external instrument 120, a user enters programming commands through the keyboard 106 using a conventional text editor. These commands are then stored on the disk 112 and used to cause the instrument 110, or the instrument 120, or both, to perform the desired functions. The present invention provides an improved method of setting up and performing the commands stored on the disk 112.

Figure 2:
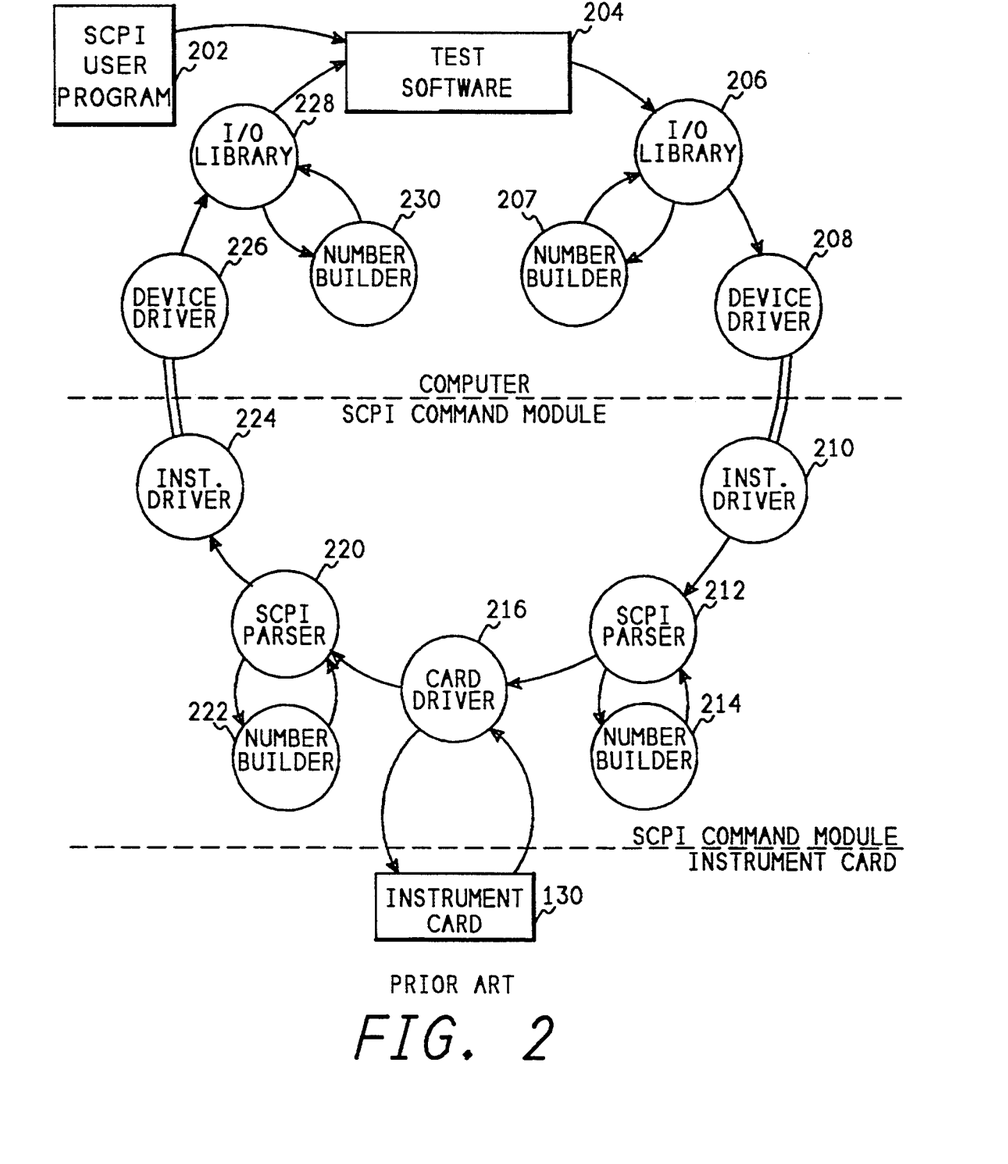
FIG. 2 shows a diagram of a prior art method of performing programmed test instrument commands.

FIG. 2 shows a diagram of a prior art method of performing the programmed test instrument commands stored on the disk 112 of FIG. 1. Referring now to FIG. 2, the programmed test instrument commands, identified here as an SCPI user program 202 are input into the computer system 100. SCPI is an acronym for Standard Commands for Programmable Instruments, and is published by the SCPI Consortium as an industry wide definition of commands to be used with all programmable test instruments. Once the commands from the user program 202 are input into the computer system 100 they are processed by the test software 204 and passed by I/O library 206 to the instrument which performs the actions requested. Before passing the commands to the instrument, library 206 calls a number builder module 207 to transform numbers from the internal computer format to an ASCII format. Library 206 then sends the commands, in the form of ASCII characters, to a device driver module 208. ASCII characters are used in order to improve readability of the program test instrument commands. As discussed in the background section above, when test instruments were first made programmable, they used a more cryptic, machine oriented, command set. This was difficult for programmers to use, because of very low association between the machine oriented commands and conventional test terminology. As programmable test instruments developed, the commands sent to the instrument became more symbolic, thus improving the readability of the commands being sent to the test instruments at the expense of execution time.

I/O Library 206 sends the ASCII commands to the device driver module 208 which then sends the ASCII to the instrument device driver 210 in the SCPI Command Module. As discussed above with respect to FIG. 1, the connection between the device driver 208 and the instrument driver 210 may be over the system bus 104, or it may be through the IEEE 488 interface 114 and instrument bus 118 to the instrument 120. In either case, the ASCII commands arrive in the command module 128 at the instrument driver 210 and are sent to the SCPI parser module 212. Because the commands are in an ASCII, readable, format, they must be parsed and converted into a machine format before the command can actually be performed. In the process of this conversion, an additional module called the number builder 214 is used to change the format of any numbers in the commands into a binary format for use by the machine. After the commands have been parsed and converted to machine instructions, they are sent to a card driver module 216 which activates an electronic instrument card 130 to perform the measurements.

Data returning from the instrument card 130 is sent to an SCPI parser 220 in order to convert this data back into an ASCII, readable, format to be sent back to the computer system 100. In order to convert the machine data back into an ASCII format, the SCPI parser 220 often uses a number builder 222 to convert all numbers from binary format into ASCII format. After the data has been converted back to an ASCII format, it is sent to an instrument driver 224 which in turn sends the data over the interface to the device driver 226 in the computer system 100. The device driver 226 sends the data to an I/O Library 228 and a number builder 230 where it is re-converted back into machine oriented form to be processed by the test software 204 contained in the computer system 100.

Thus, in the prior art, human readable commands are sent to the instrument where they must be parsed and converted to a machine readable form, processed, converted back to a human readable ASCII form, and sent back to the computer system. After arriving back in the computer system, before the data from the instrument can actually be processed, the numbers must be re-converted back into a machine oriented form within the computer system 100. Furthermore, if a test is run multiple times, all this conversion is repeated each time the test is run.

Figure 3:
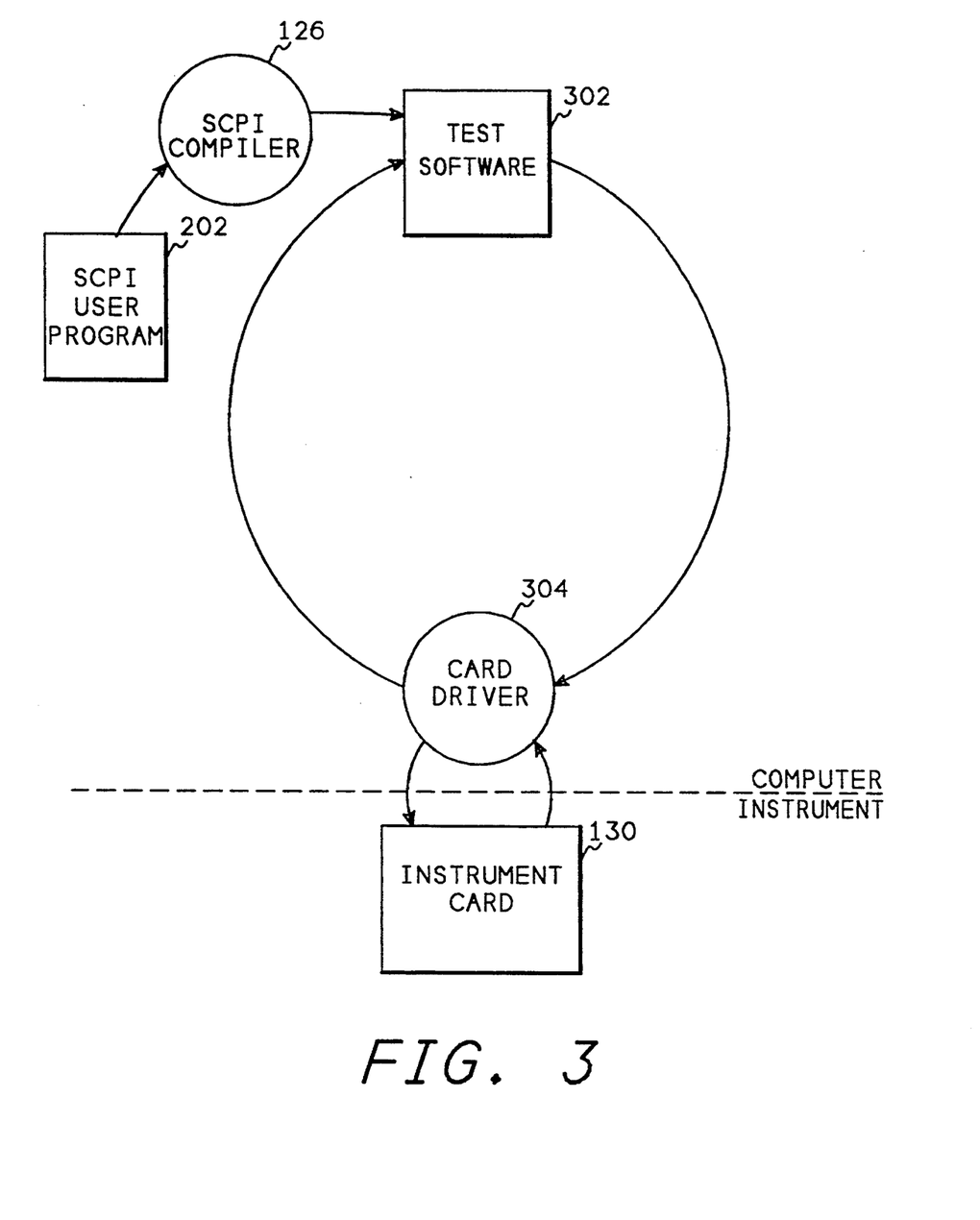
FIG. 3 shows a diagram of the present method of performing programmed test instrument commands.

FIG. 3 shows a diagram of the present method of performing the program test instruments commands to an internally connected instrument such as instrument 110 of FIG. 1. Referring now to FIG. 3, in the present invention, the SCPI user program 202 is sent to the SCPI compiler 126 of the present invention. The commands within the SCPI user program 202 are identical to the commands used in the prior art method, thus, the commands are still in a very human readable form. In the present invention, however, the commands are converted by the SCPI compiler 126 (also shown in FIG. 1) prior to any processing of those commands by the computer system 100. This conversion is performed only one time, regardless of the number of times the test will be run with the programmable test instrument. After the compiler 126 has converted the commands into a machine usable form, the computer system 100 then executes the commands as part of the test software 302. Because these commands are already in a machine usable form, the commands can be sent directly to the card driver 304, which performs the same functions as the card driver 216 (FIG. 2). There is no need to convert the commands to an ASCII form only to have the commands be converted back by a parser within the electronic instrument. Thus, the parser in the instrument can be eliminated. Also, as shown in FIG. 3, the driver modules, such as the device driver 208 (FIG. 2) and the instrument driver 210 (FIG. 2) are eliminated. In other embodiments of the present invention, however, the device driver and instrument drivers may be retained.

With an internally connected instrument, the card driver 304 may be incorporated into the computer system 100, as shown in FIG. 3 thus eliminating the command module shown in FIG. 2. In other embodiments, the command module could be retained.

Once the commands have arrived at the card driver 304, the card driver manipulates registers on the instrument card 130 to cause the instrument card to perform the requested operations. The instrument card then sends machine formatted data back to the card driver 304. The card driver 304 then sends this machine formatted data directly back to the computer system 100, thus bypassing the SCPI parser 220, the number builder 222, the I/O Library 228, and the number builder 230 of FIG. 2.

If the instrument is an externally connected to the computer system 100, such as external instrument 120 (FIG. 1), the device drivers and I/O library, as shown in FIG. 2, would still be needed. The Number builders shown in FIG. 2 would be eliminated. Also, a simple form of parser would still be needed in the instrument, however, this parser is significantly simpler and faster than the parsers 212 and 220 of FIG. 2. Although the savings is less for an externally connected instrument than for an internally connected instrument, a savings is still realized in using the SCPI compiler with an external instrument.

Figure 4:
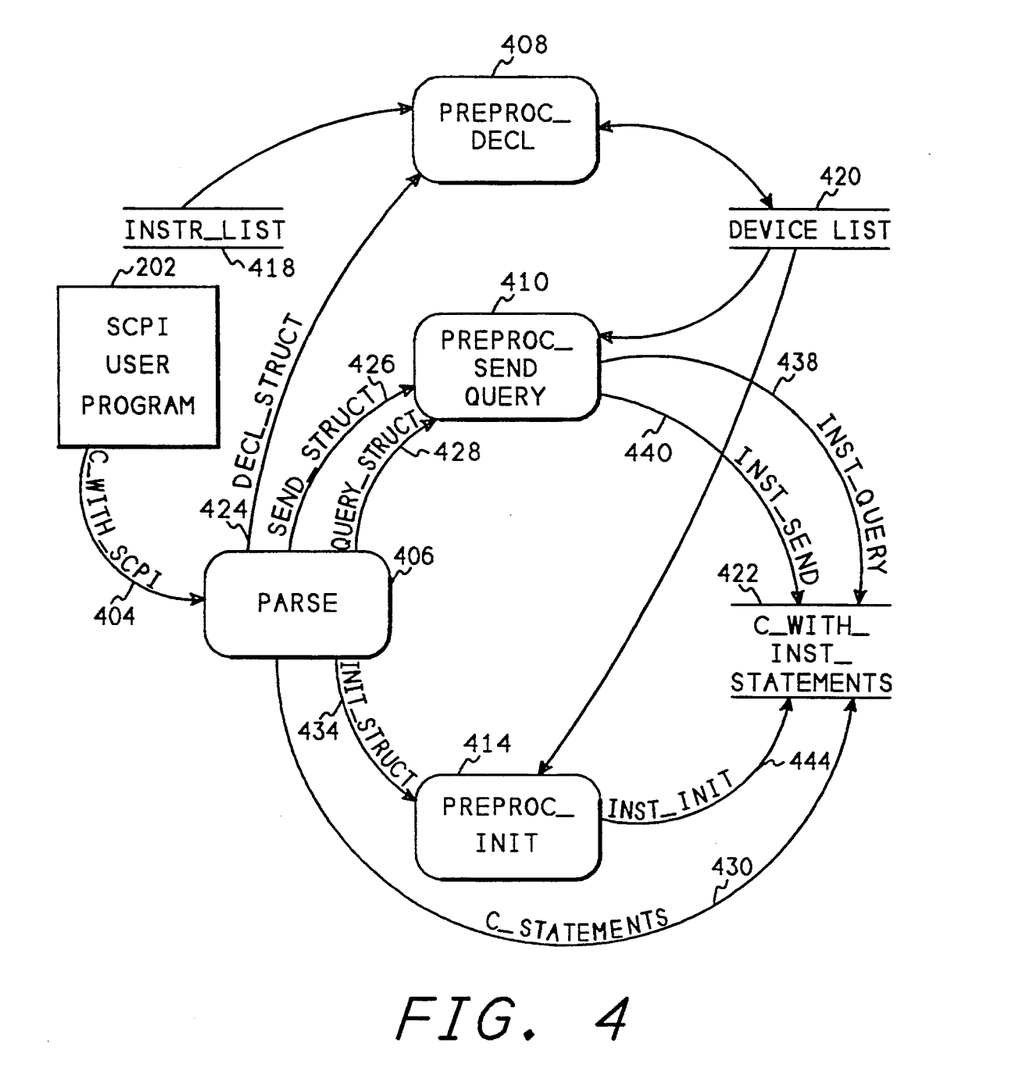
FIG. 4 shows a data flow diagram of the compiler of the present invention.

FIG. 4 shows a data flow diagram of the compiler 126 (FIG. 1) of the present invention. As described above with respect to FIG. 3, the compiler illustrated in the data flow diagram of FIG. 4 takes the SCPI user program 202 and converts it into a machine usable form within the computer system 100. Referring now to FIG. 4, the SCPI user program 202 is sent to the parse process 406 over the C_WITH_SCPI data flow 404. Parse process 406 removes all comments and standard computer language statements and sends these over the C_STATEMENTS data flow 430 to the C_WITH_INST_STATEMENTS file 422. Although the present invention is usable with any computer language, in the preferred embodiment the present invention is implemented as a preprocessor for the "C" and "C++" programming languages. Therefore, the parse process 406 removes all standard C and C++ statements and all standard C and C++ comments from the SCPI user program and sends these over data flow 430 to the file 422. After removing the comments, the parse process 406 searches the file for SCPI statements. When an SCPI instrument declaration statement is encountered, this statement is sent over data flow DECL_STRUCT 424 to the PREPROC_DECL process 408. When an SCPI instruction to send data to an instrument is encountered, parse process 406 sends this statement over the SEND_STRUCT data flow 426 to the PREPROC_SEND_QUERY process 410. When an SCPI instrument query statement is encountered, parse process 406 sends this statement over the QUERY_STRUCT data flow 428, also to the PREPROC_SEND_QUERY process 410. When an SCPI initialize instrument statement is found, parse process 406 sends this statement over the INIT_STRUCT data flow 434 to the PREPROC_INIT process 414.

When an instrument declaration statement is received by the PREPROC_DECL process 408, this process queries the INSTR_LIST file 418, located on the disk 112 (FIG. 1) to determine if the instrument has been defined to the system. If the instrument has been defined, the information about the instrument is retrieved by the PREPROC_DECL process 408 and used to build a device list entry which is stored in the DEVICE_LIST file 420. The entry in the device list file 420 includes all the information about the instrument from the INSTR_LIST 418 as well as the address of the device. This allows the compiler to determine later whether the device is directly addressable over the system bus, for example, such as instrument 110 (FIG. 1) or whether the instrument must be addressed through an interface such as IEEE 488 interface 114 (FIG. 1). Using this information allows the compiler to later optimize the instructions that are generated for addressing this particular instrument. For example, if an instrument is directly addressable on the system bus, such as instrument 110, certain SCPI commands might be implemented as direct reads or writes to registers directly addressable on the system bus. However, if the instrument must be addressed through the IEEE 488 interface 114, these commands would have to be sent through a device driver module instead.

When the PREPROC_INIT process 414 receives an SCPI initialization statement over data flow 434, it generates C code to call the initialization function of a device driver to initialize the instrument The generated statements are sent in the INST_INIT data flow 444 to the C_WITH_INST_STATEMENTS file 422.

SCPI initialization statements include the INST_STARTUP statement as well as the INST_OPEN statement described below with respect to Table 1.

When an SCPI instrument query statement is received over data flow 428, the PREPROC_SEND_QUERY process 410 queries the DEVICE_LIST file 420 to get the instrument address, and a definition of the SCPI commands and expected parameters for the instrument. If the query statement parameters match the expected parameters, the PREPROC_SEND_QUERY process 410 generates C statements to perform the query function and sends these over the INST_QUERY data flow 438 to the C_WITH_INST_STATEMENTS file 422. When the DEVICE_LIST file defines that access to the instrument will be through the use of driver routines, the PREPROC_SEND_QUERY process creates C statements to build a single data structure to pass all parameters to the driver routine, and creates C statements to build a second single data structure to return all information from the instrument. Also, the data structure for passing parameters contains a character array for each parameter as well as a type field for each parameter. Parameters may be of different types, even though they are each stored in a character array, and the type field identifies the specific parameter type to the driver routine.

The PREPROC_SEND_QUERY process also determines from the DEVICE_LIST file whether the instrument can be accessed directly on the system bus. Based on this determination the PREPROC_SEND_QUERY process can create C statements to bypass the device drivers and access instrument registers directly through the system bus.

The data flow diagram of FIG. 4 and the description thereof occurring above are exemplary only. Other SCPI instrument statements are processed in a similar manner as described above with respect to FIG. 4. After all of the SCPI user program 202 has been processed the statements in the C_WITH_INST_STATEMENTS file 422 are processed by the C compiler in the computer system 100 to generate the test software 124. After the test software 124 has been created, the user may enter commands through the keyboard 106 to execute the test software as many times as desired. Because all the human readable commands and ASCII data contained in the SCPI user program 202 have been converted to machine usable data by the compiler 126, no additional processing of ASCII information is required.

Table 1 shows an example program containing SCPI statements embedded within a "C" language program. Table 2 shows the output of the compiler 126 after processing the program of Table 1. Referring now to Table 1 and Table 2, the following will discuss the example program of Table 1 and how the compiler 126 generates the resulting statements shown in Table 2.

Lines 1 through 4 of Table 1 show "include" statements which are a part of the C programming language, so the parse process 406 (FIG. 4) copies these statements directly to the file 422, resulting in lines 1 through 4 shown in Table 2. Line 5 of Table 1 is an instrument declaration statement which is directed by the parse process 406 to the PREPROC_DECL process 408. The word "counter" shown in line 5 of Table 1 is the name of the instrument and this name is used to build an "int" statement shown as line 5 in Table 2. The other two parameters, "E1333A" and "DIRECT" are parameters used to build the DEVICE_LIST file 420. These parameters are also shown as a comment in line 5 of Table 2.

Lines 6, 7, and 8 of Table 1 are conventional C language statements, so the parse process 406 copies these lines directly to Table 2 where they appear as lines 6, 7, and 8.

Line 9 is a SCPI instrument start up command. This command is directed by the parse process 406 to the PREPROC_INIT process 414 which generates a call to the OS_INIT subroutine. This call is shown on line 9 in Table 2. Also, line 9 includes a comment with the word "STARTUP" to indicate that this line was generated from the start up command of the input file in Table 1.

Line 10 of Table 1 shows an instrument open command. This command is sent by the parse process 406 to the PREPROC_INIT process 414. The PREPROC_INIT process 414 generates a block of code within the C language, which is all shown on line 10 of Table 2. The block of code starts with a left brace character followed by an extern statement which identifies that a function called "E33_HEADER FN" is an externally defined function. The next C statement within the block calls the function "OS_OPEN" and passes the second parameter from line 10 of Table 1 as a parameter to this function. The E33_HEADER_FN function identified in the previous extern statement of Table 2 is also passed as a parameter. The results of the OS_OPEN call are placed in the first variable of the instrument open command, counter, shown in line 10 of Table 1. The block is terminated by a right brace. Thus, considerable manipulation of the statement of Table 1 is performed in order to create the series of statements in Table 2.

Lines 11 through 14 of Table 1 are conventional C language programming statements, and these are passed directly into table 2 as lines 11 through 14.

Line 15 of Table 1 is a query statement which is used to generate lines 15 through 21 of Table 2. In line 15 of Table 2 two data structures are created. The first of these data structures, given the name "in", is used to pass information into the device driver which will be called in a subsequent statement, and the second of these data structures, called "out" is used to return information from the device driver. Within these data structures all parameters are defined as character data, even though information actually passed to the device driver may be in other formats, for example, floating point. In addition, each parameter passed into the device driver has an associated parameter type which is used to tell the device driver the actual format of the data in the parameter. Lines 16 through 19 load information from the input statement 15 of Table 1 into the "in" data structure to be passed to the device driver. Line 20 then calls the device driver to perform the query command within the instrument. Line 21 stores the results of the query into the user data area.

Lines 16 through 19 of Table 1 are conventional C language statements which are copied directly to lines 22 through 25 of Table 2.

As can be seen by the above example, the input statements of Table 1 require considerable processing to result in the statements of Table 2. Because of the method of the present invention, however, this processing is only performed once while the actual instrument query may occur many times.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A method for performing programmed test instrument commands in an automated test system, wherein said programmed test instrument commands are combined with language commands of a programming language, said method comprising the steps of:
   (a) reading a file containing said programmed test instrument commands and said language commands;
   (b) separating said programmed test instrument commands from said language commands;
   (c) precompiling said programmed test instrument commands to create a second set of language commands;
   (d) combining said language commands and said second set of language commands into a combined set of commands; and
   (e) compiling said combined set of commands into a single executable form; and
   (f) performing said executable form in said automated test system.

2. The method of claim 1 wherein step (c) further comprises the steps of:
   (c1) precompiling said programmed test instrument commands into a form wherein input and output

TABLE 1

```
1   #include <stdlib.h>
2   #include <stdio.h>
3   #include <types.h>
4   #include <hpsl_types.h>
5   INST_DECL(counter, "E1333A", DIRECT);
6   main( )
7   {
8           double counter_reading;
9           INST_STARTUP( );
10          INST_OPEN(counter, "VXI,16");
11          if (! counter) {
12                  (void) fprintf(stderr, "Failed to open counter card   n");
13                  exit(1);
14          }
15          INST_QUERY(counter, "MEASURE:FREQUENCY? 1000", "", &counter_reading);
16          (void) printf("The reading returned by the counter was %f   n",
17                          counter_reading);
18          return(0);
19  }
```

TABLE 2

```
1   #include <stdlib.h>
2   #include <stdio.h>
3   #include <types.h>
4   #include <hpsl_types.h>
5   int counter; /* name E1333A, mode DIRECT */
6   main( )
7   {
8           double counter_reading;
9           os_init( );/* STARTUP */
10          {extern E33_header_fn( );counter = os_open("VXI,16",E33_header_fn);}
11          if (! counter) {
12                  (void) fprintf(stderr, "Failed to open counter card   n");
13                  exit(1);
14          }
15          { struct {short sub1;short p1_type; char p1[10];short p2_type; char p2[10];} in;struct {char p1[10];} out;
16  in.sub1= 0;
17  in.p1_type= 0;((HPSL_FLOAT64*)&in.p1)—>num= 1000;
18  ((HPSL_FLOAT64*)&in.p1)—>suffix=0;
19  in.p2_type= -1;
20  {extern E33Lmeas_freq_qry( );if (!instr_query(counter,E33Lmeas_freq_qry,&in,&out)){
21  *&counter_reading=(*(HPSL_FLOAT64*)&out.p1).num;}}}
22          (void) printf("The reading returned by the counter was %f   n",
23                          counter_reading);
24          return(0);
25  }
``` operations with an instrument are performed by calling device driver routines; and (c2) precompiling said programmed test instrument commands to cause all parameters passed to a device driver routine to be passed within a single data structure.

3. The method of claim 2 wherein step (c) further comprises the step of:

(c3) precompiling said programmed test instrument commands to cause all parameters passed back from a device driver routine to be passed within a single data structure.

4. The method of claim 2 wherein step (c2) further comprises the step of:

(c2A) precompiling said programmed test instrument commands to cause each of one or more parameters passed in said single data structure to be defined as a single data type, regardless of an actual data type of each of said one or more parameters; and (c2B) precompiling said programmed test instrument commands to cause each of said one or more parameters passed in said single data structure to have an associated type field defining an actual data type of each of said one or more parameters.

5. The method of claim 1 wherein step (c) further comprises the step of optimizing said executable form.

6. The method of claim 5 wherein said optimization comprises creating an executable form that directly accesses said instrument for a first predefined subset of said programmed test instrument commands and calls said device drivers to perform a second predefined subset of said programmed test instrument commands.

7. The method of claim 1 wherein said programmed test instrument commands are commands within the Standard Commands for Programmable Instruments language.

* * * * *